United States Patent [19]

Etoh et al.

[11] Patent Number: 4,873,672

[45] Date of Patent: Oct. 10, 1989

[54] DYNAMIC RANDOM ACCESS MEMORY CAPABLE OF FAST ERASING OF STORAGE DATA

[75] Inventors: Jun Etoh, Hachioji; Katsuhiro Shimohigashi, Musashimurayama; Kazuyuki Miyazawa, Iruma; Katsutaka Kimura, Akishima; Takesada Akiba, Kokubunji, all of Japan

[73] Assignees: Hitachi, Ltd., Tokyo; Hitachi Device Engineering Co., Ltd., Mobara, both of Japan

[21] Appl. No.: 51,715

[22] Filed: May 20, 1987

[30] Foreign Application Priority Data

May 21, 1986 [JP] Japan ................................. 61-114640

[51] Int. Cl.⁴ .............................................. G11C 7/00
[52] U.S. Cl. ...................................... 365/218; 365/203
[58] Field of Search ......................... 365/218, 203, 205

[56] References Cited

U.S. PATENT DOCUMENTS 4,758,990  7/1988  Uchida ................................. 365/203

OTHER PUBLICATIONS

IEEE Journal of Solid–State Circuits—vol. SC-19, No. 5, Oct. 1984, pp. 619–623.

*Primary Examiner*—James W. Moffitt
*Attorney, Agent, or Firm*—Antonelli, Terry & Wands

[57] ABSTRACT

This invention relates to a semiconductor memory having a high speed operation and a high integration density. When a high integration semiconductor memory is applied to a large scale computer system, storage data must be erased at a high speed for data security. The present invention erases the storage data by a method which is different from the write method of conventional prior art. In the invention, the erasing operation is made by continuously selecting word lines while sense amplifiers are kept in this on-state. The present invention includes a control circuit for attaining such an operation, and can be used for a semiconductor memory implemented in a computer system accessed by a plurality of users.

15 Claims, 17 Drawing Sheets

DYNAMIC RANDOM ACCESS MEMORY CAPABLE OF FAST ERASING OF STORAGE DATA

BACKGROUND OF THE INVENTION

This invention relates generally to a semiconductor memory and more particularly to memory array driving circuits capable of fast erasing of storage data in a memory.

Typical prior art techniques will be first explained with reference to a dynamic random access memory (DRAM) using CMOS (Complementary Metal Oxide Semiconductor) shown in FIG. 1 of the accompanying drawings, by way of example. In the drawing, the memory cells are of a folded bit line structure. The memory array has a matrix structure shown as consisting of four pairs of data lines and four word lines, to simplify the description. It has multiplexed address inputs, in order to receive external address signals in a time divided manner.

In FIG. 1, symbols $MC_{00}$ to $MC_{33}$ represent memory cells for storing data, $D_0$ to $D_3$ and $\overline{DHD}\,0$ to $\overline{DHD}\,3$ are data lines and $W_0$ to $W_3$ are word lines. An X decoder XDEC for selecting the word lines has a circuit construction such as shown in the drawing. $PC_0$ to $PC_3$ represent data line precharge circuits and $SA_0$ to $SA_3$ are sense amplifiers for amplifying the data read out from the memory cells. I/0 represents a common data line for data transfer to the memory cells and $Y_0$ to $Y_3$ are Y decoder output lines for switching the data lines and the common data lines.

A Y decoder YDEC for selecting and driving the Y decoder output lines has a circuit construction such as shown in FIG. 1. Symbol MA represents an amplifier for amplifying the data that is read out from the memory cell on the common data line. RASB and CASB are input buffer circuits for converting a row address strobe signal $\overline{RAS}$ and a column address strobe signal $\overline{CAS}$ from a TTL level to the power source level inside a chip, respectively, and consist of CMOS inverters or logical gates.

XAB and YAB are buffer circuits (i.e. X address buffer circuit and Y address buffer circuit) for row address signals (X address signals) and column address signals (Y address signals) from outside the chip, receive the address signals of the TTL level inputted thereto from outside the chip and convert them to signals of a chip internal voltage level, respectively. Each of these circuits consists of a CMOS inverter or a logic gate.

WEB is a buffer circuit for converting a write control signal $\overline{WE}$ (write enable signal) from the TTL level to the chip internal voltage level and consists of a CMOS inverter or a logic gate. DiB is a data input buffer circuit for converting an external write data from the TTL level to the chip internal voltage level and generates a true signal and a complementary signal. It consists of a CMOS inverter or a logic gate. DOB is a data output buffer circuit for outputting the data read out from the memory cell and consists of an inverter circuit. $T_1$, $T_2$, $T_3$, $T_6$ and $T_7$ represent clock generators and each consists of a plurality of CMOS inverters or logic gates in accordance with a necessary delay time. Among them, $T_2$ and $T_6$ generate the true signal and the complementary signal, and $T_4$ and $T_5$ are internal address signal generators which generate true and complementary address signals and consist of a CMOS inverter or logic gate. In the drawing, MOS-FET with arrow represent PMOS with the others representing NMOS. $V_{cc}$ represents an internal voltage level and nodes with symbols are connected to the internal voltage line. $V_{DP}$ represents a $\frac{1}{2}V_{cc}$ voltage and the nodes with this symbol are connected to a circuit generating this voltage.

The data read operation from the memory cell is made in the following manner. When the $\overline{RAS}$ signal changes from the High to Low level, the buffer circuit RASB generates the row (X) control signal $\phi_R$. After the necessary delay time corresponding to this signal, a word line drive signal $\phi_X$, sense amplifier drive signals $\phi_{SA}$, $\overline{\phi_{SA}}$ and a data line precharge signal $\overline{\phi_{PC}}$ are generated. On the other hand, the external address signal Ai when the $\overline{RAS}$ signal changes from the High level to the Low level is taken into the chip by the X address buffer XAB and the X control signal (e.g. $\phi_R$). This signal is turned to X system internal address signals $a_{xi}$ and $\overline{a_{xi}}$ by the internal address signal generator $T_4$. These signals are inputted to the X decoder XDEC to select one of the word lines $W_0$ through $W_3$. It will be assumed hereby that $W_0$ is selected. After the word line is selected, the word line drive signal $\phi_X$ is generated and the selected word line $W_0$ is driven from the Low level to the High level. At this time the data line precharge signal $\overline{\phi_{PC}}$ changes from the High level to the Low level and the precharge circuit PC is turned OFF. Each data line is at $\frac{1}{2}V_{cc}$ ($=V_{DP}$) which is the half of the power source voltage $V_{cc}$.

When the word line $W_0$ is driven, the memory cell signals are read out from all the memory cells $MC_{00} \sim MC_{03}$ connected to the word line $W_0$ to each data line connected thereto. In this case, the signals are read out to the data lines $D_0$, $D_1$, $D_2$ and $D_3$. Thereafter, the sense amplifier driving signal $\phi_{SA}$ changes from the Low level to the High level and $\overline{\phi_{SA}}$ changes from the High level to the Low level to drive the sense amplifiers $SA_0 \sim SA_3$. These amplifiers amplify the memory cell signals read out to the data lines and set the level of the data line pair to 0 V and $V_{cc}$ in accordance with the memory cell signal. Next, when the $\overline{CAS}$ signal changes from the High level to the Low level, the buffer circuit CASB generates the column (Y) control signal $\phi_c$ and after the passage of a necessary delay time, a Y decoder output line drive signal $\overline{\phi_y}$ is generated in response to this column control signal $\phi_c$.

On the other hand, the external address signal Ai when $\overline{CAS}$ changes from the High level to the Low level is taken into the chip by the Y address buffer circuit YAB and the Y control signal (e.g. $\phi_c$). This signal is turned to the Y internal address signals $ay_i$, $\overline{ay_i}$ the internal address signal generator $T_5$. This signal is inputted to the Y decoder YDEC and selected one of the Y decoder output lines $Y_0$ to $Y_3$. It will be assumed hereby that $Y_0$ is selected. Then, a Y decoder output line drive signal $\overline{\phi_y}$ is generated and the selected Y decoder output line $Y_0$ is driven from the Low level to the High level so that the data lines $D_0$, $\overline{D_0}$ are connected to the common data line I/0 and the memory cell data are read out on the common data line I/0. Incidentally, though the common data line I/0 is precharged in advance to a certain voltage, a precharge circuit is not hereby illustrated. The data thus read out are amplified by an amplifier MA and outputted outside the chip through the data output buffer circuit DOB.

After the operations described above are complete, the $\overline{RAS}$ signal and $\overline{CAS}$ signal change from the Low level to the High level. Therefore, the X (row) control signal $\phi_R$ changes to the Low level, the word line driving signal $\phi_X$ changes to the Low level and the selected word line $W_0$ changes to the low level, too. Accordingly, the data is stored once again in the memory cell. Thereafter the sense amplifier driving signal $\phi_{SA}$ changes to the Low level while $\overline{\phi_{SA}}$ changes to the High level, thereby turning OFF the sense amplifier. Also, the Y (column) control signal $\phi_C$ changes to the Low level and the Y decoder output line driving signal $\overline{\phi_y}$ changes to the High level in response to the former an the selected Y decoder output line $Y_0$ changes to the Low level. Thereafter the data line precharge signal $\overline{\phi_{PC}}$ changes to the High level, precharging the data line to the $1/2\ V_{cc}$ level. The common data line is precharged, too, and enters the waiting state.

The data write operation to the memory cell is made in the following way. In the write cycle, the procedures from the read-out of the memory cell signal and the amplification of the read signal by the sense amplifier are the same as those in the read cycle. Thereafter, when the $\overline{WE}$ signal changes from the High level to the Low level, the buffer circuit WEB generates the internal write control signal $\phi_W$. This signal is turned to a true signal and a complementary signal by the timing pulse generator $T_6$ so as to separate the common data line I/0 and the amplifier MA and to connect the common data line I/0 to the data input buffer DiB. The write data Di when the $\overline{WE}$ signal changes from the High level to the Low level is taken into the chip by the data input buffer circuit and the write control signal (e.g. $\phi_W$) and turned to the true signal and the complementary signal. Accordingly, the write data is transferred to the common data line I/0. If the $\overline{CAS}$ signal changes from the High level to the Low level at this time, one of the Y decoder output, lines $Y_0 \sim Y_3$ is driven from the Low level to the High level. It will be assumed hereby that $Y_0$ is driven. When $Y_0$ changes to the High level, the write data is transferred to the data lines $D_0$, $\overline{D_0}$ and written into the memory cell connected to the selected word line. Thereafter, when the $\overline{RAS}$ signal, $\overline{CAS}$ signal and $\overline{WE}$ signal change from the Low level to the High level, the word line level changes to the Low level in the same way as in the read cycle and the write data are stored in the memory cell. Thereafter the data line and common data line are precharged ane enter the waiting state.

As one of the prior art references related with the apparatus of this kind, mention can be made of IEEE J. Solid-State Circuits, vol. SC-19, No. 5 (1984), pp. 619–623.

SUMMARY OF THE INVENTION

Data security has become important in recent years in a multi-users system wherein many users share a main memory. It is therefore preferred that the content of the main memory be erased quickly after the job of a party is complete. In the conventional memory,, however, the data read and write operation of the memory data are effected for each bit as described already, and this type is prevailing in DRAMs at present. When it becomes necessary to erase all the contents of the memory cell in such a memory, predetermined data for erasing must be written for each bit and an extended period of time is necessary for this data write operation. In other words, the conventional memories do not take into consideration the necessity for fast erasing all the memory contents.

In the main memory using the conventional semiconductor memory, data must be erased for each bit to cope with the demand for erasing all the memory contents at a high speed, as described above. Therefore, the conventional system is not free from the drawbacks in that a long period of time is necessary for erasing and the efficiency of use of the system drops in consequence.

The present invention accomplishes the object described above by disposing a circuit for keeping a sense amplifier in its on-state and a circuit for keeping a data line precharge circuit in its off-state while a memory content is erased, and a circuit for generating address signals inside a chip in order to sequentially select and drive word lines in the mean time.

In the circuit construction described above, the data line precharge circuit is kept non-driving, and then predetermined data for erasing is held by the sense amplifier. Thereafter the address signal generation circuit inside the chip is actuated to sequentially select the word lines, so that whenever one word line is selected and driven, the memory contents of a plurality of memory cells connected to that word line are erased and the erasing time of the memory content can be reduced drastically.

Thus the present invention is directed to provide a memory capable of fast erasing all the memory contents.

These and other objects and may of the attendant advantages of this invention will be readily appreciated from the following detailed description when considered in connection with the accompanying drawings.

DESCRIPTION OF THE PREFERRED EMBODIMENTS

Figure 1:
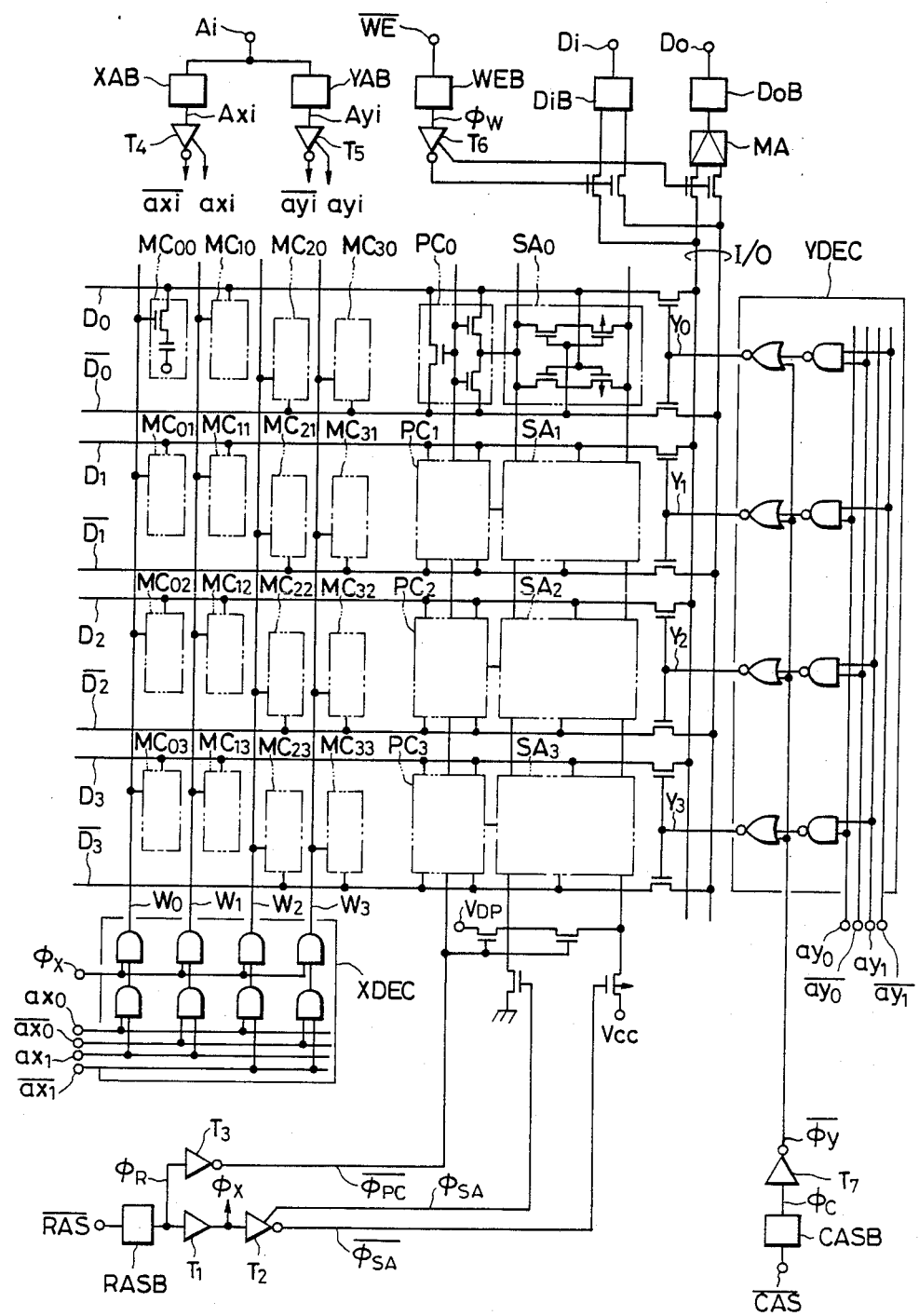
FIG. 1 is a diagram showing a conventional memory.
Figure 2A:
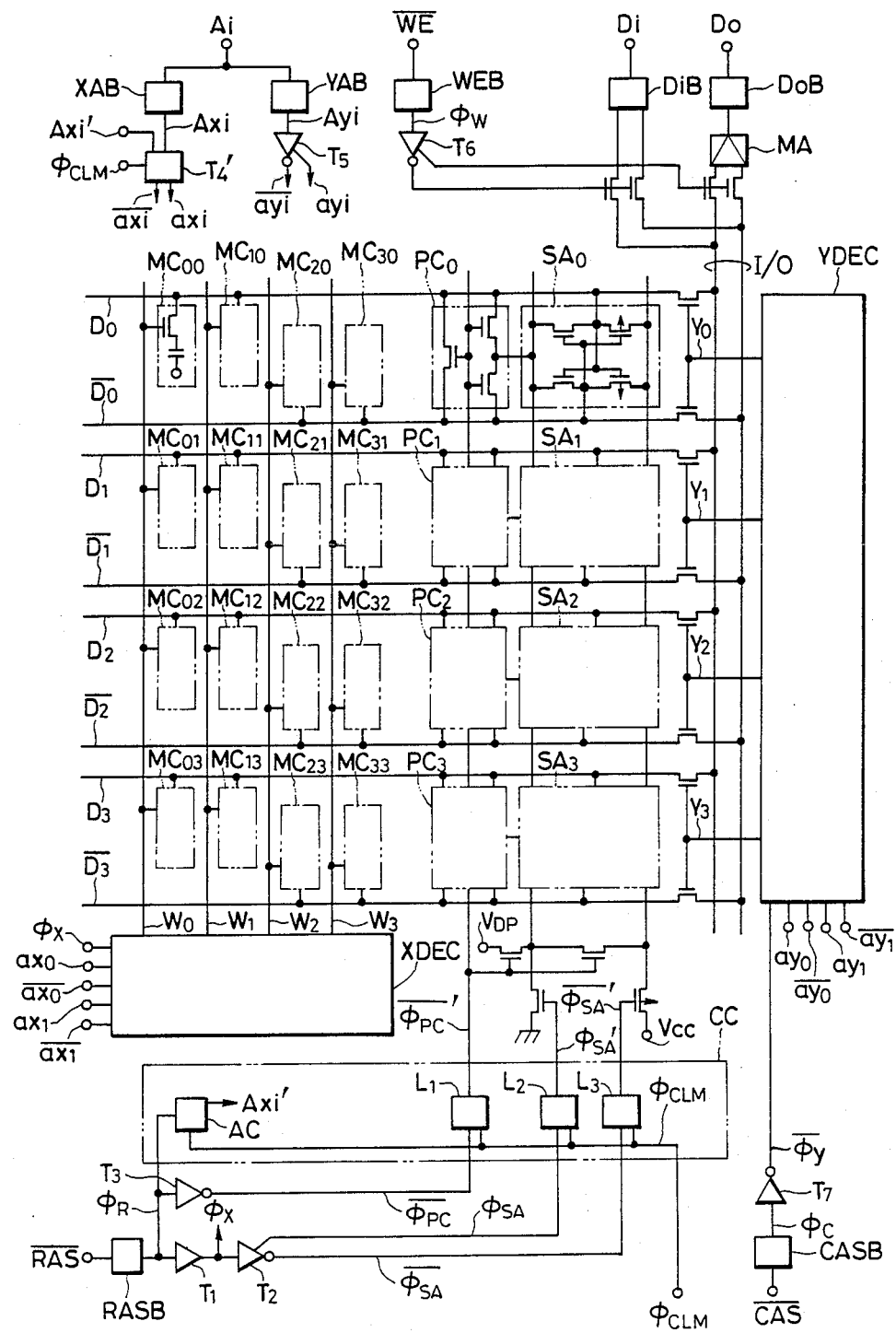
FIGS. 2A to 7 show a first embodiment of the present invention.

Hereinafter, the first embodiment of the present invention will be described with reference to FIG. 2A. The circuit shown in FIG. 2A is produced by adding a control circuit CC for erasing storage data, which is controlled by a control signal $\phi_{CLM}$ for erasing the storage data inputted from outside a memory chip, and an X (row) system internal address signal generator $T_4'$ to the conventional memory circuit shown in FIG. 1. The rest of the circuit constructions and operations are the same as those of the conventional circuit shown in FIG. 1 and like reference numerals are therefore used to identify like circuit constituents as in FIG. 1. Hereinafter, the construction and operation of the control circuit for erasing the storage data will be described primarily.

Figure 2B:
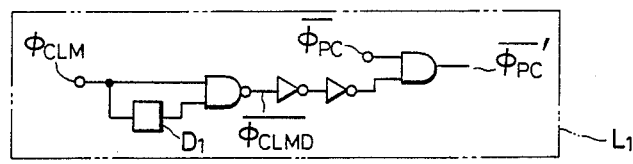
Figure 2C:
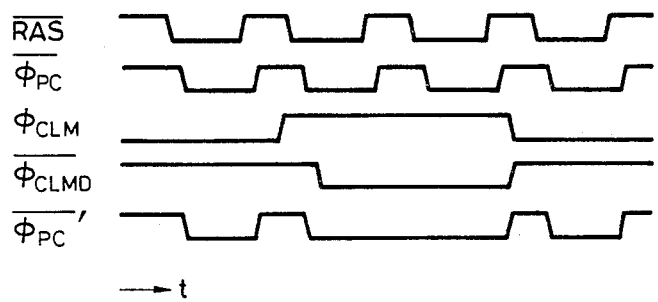
Figure 3A:
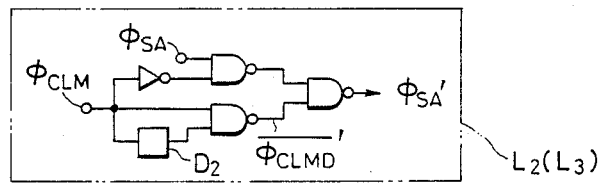
Figure 3B:
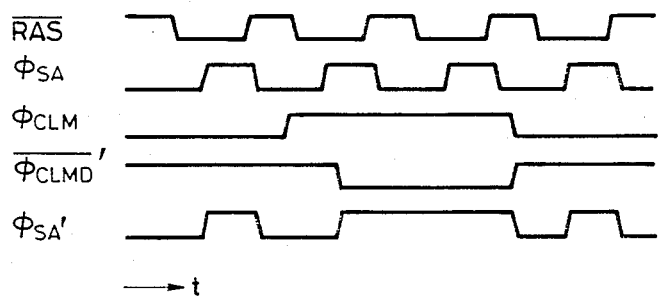
Figure 4A:
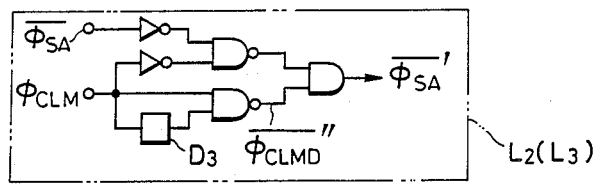
Figure 4B:
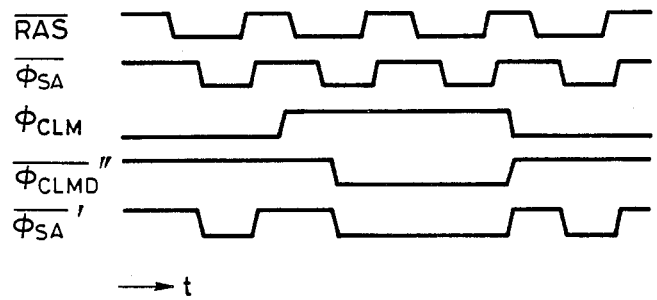

In FIG. 2A, symbol $L_1$ represents a data line precharge signal control circuit which outputs a signal $\overline{\phi_{pc}}'$ keeping an input data line precharge signal $\overline{\phi_{pc}}$ at the Low level in order to keep the data line precharge c OFF while the memory data is erased. The circuit such as shown in FIG. 2B is used as this circuit, for example. In FIG. 2B, symbol $D_1$ represents a delay circuit, which consists of a plurality (even-numbered) of MOS inverters connected to one another. FIG. 2C shows operating waveforms. Symbols $L_2$ and $L_3$ represent those circuits which outputs signals $\phi'_{SA}$, $\overline{\phi'_{SA}}$ keeping input sense amplifier driving singals $\phi_{SA}$, $\overline{\phi_{SA}}$ at the High and Low levels, respectively, in order to keep the sense amplifier SA ON while the memory data is erased. The circuits such as shown in FIGS. 3A and 4A can be used as this circuit, for example. Symbols $D_2$ and $D_3$ in FIGS. 3A and 4A represent delay circuits analogous to the one shown in FIG. 2B. FIGS. 3B and 4B show the operating waveforms of the circuits shown in FIG. 3A and FIG. 4A, respectively.

Figure 5A:
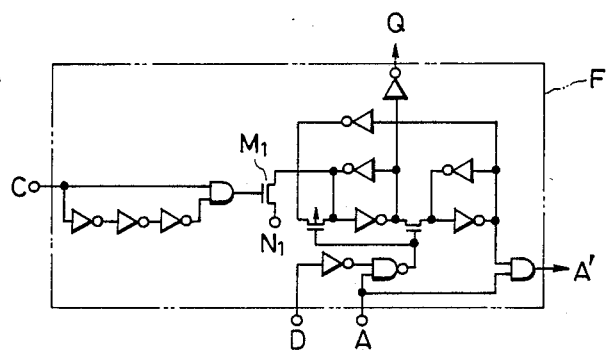
Figure 5B:
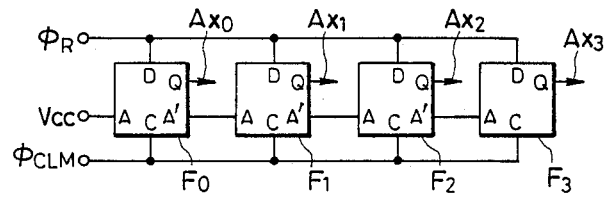

Symbol AC represents a counter circuit for generating an address signal $A_{xi}'$ inside the memory chip in order to erase the storage data of the memory. This circuit is obtained by connecting a plurality of circuits F shown in FIG. 5A as shown in FIG. 5B ($F_0 \sim F_3$) Symbol $T_4'$ represents an internal address signal generator which receives the address signal $A_{xi}$ from outside the memory chip or the address signal $A_{xi}'$ from inside the memory chip and generates true and complementary address signals. The circuit shown in FIG. 6 can be used as this circuit, for example.

Figure 6:
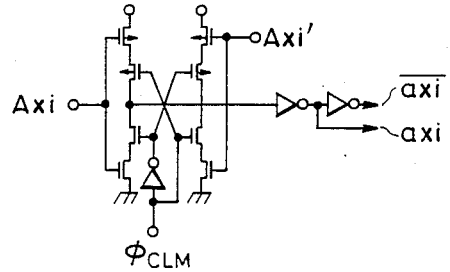
Figure 7:
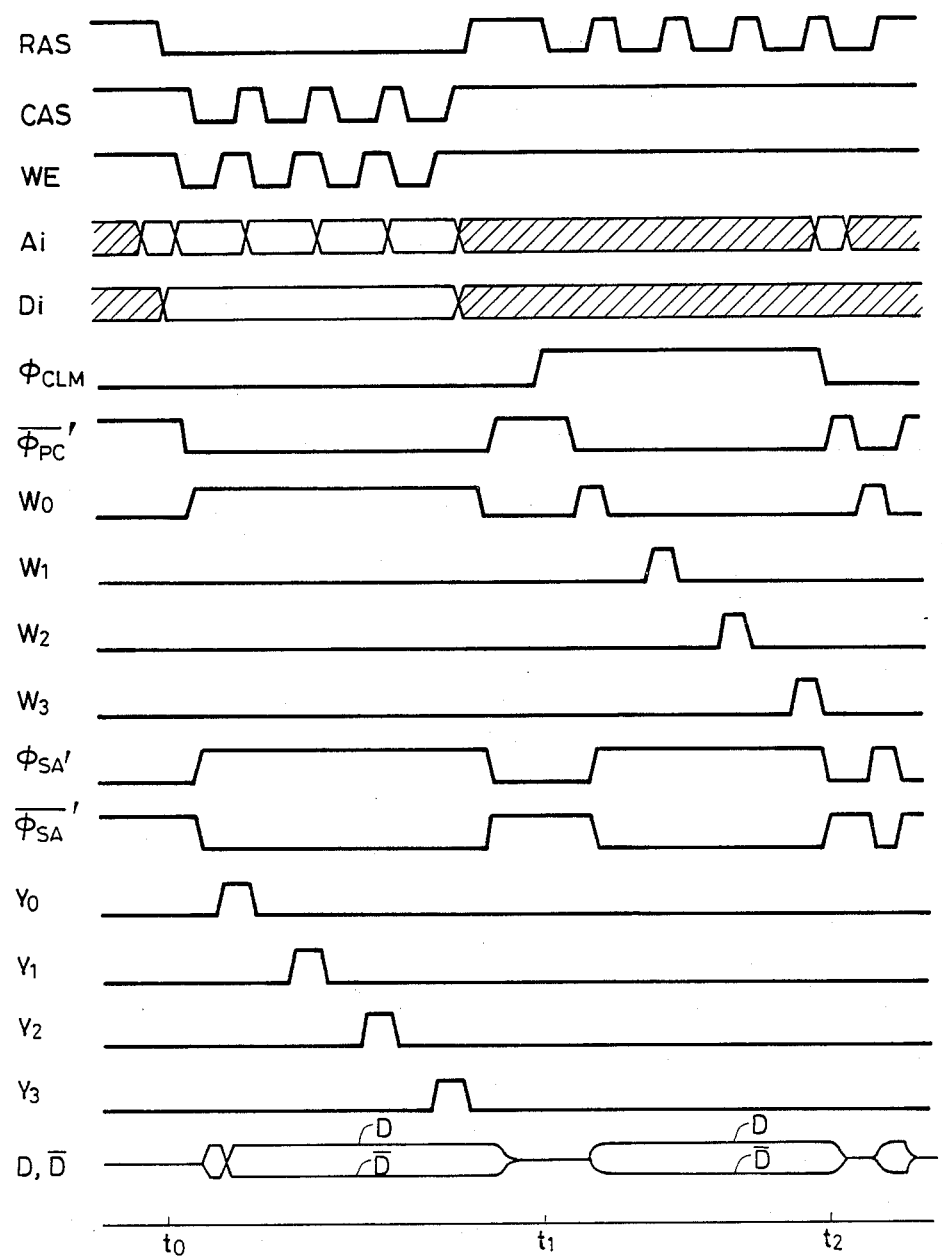

The erasing operation of the memory shown in FIG. 2A will be described with reference to the operating waveforms shown in FIG. 7. In FIG. 7, a period from $t_0$ to $t_1$ shows the write operating waveforms in an ordinary page mode and a period from $t_1$ to $t_2$ shows the operating waveforms when erasing the storage data of the memory. First of all, the write operation in the page mode will be described. During the write operation in the page mode, control signal $\phi_{CLM}$ for erasing the storage data is at the Low level. Therefore, the data line precharge signal $\overline{\phi_{PC}}$ exhibits the same waveform as the signal $\overline{\phi_{PC}}$ formed by the timing pulse (clock) generator $T_3$ as is obvious from FIG. 2B. Similarly, the sense amplifier driving signals $\phi_{SA'}$, $\overline{\phi_{SA'}}$ exhibit the same waveforms as the signals $\phi_{SA}$, $\overline{\phi_{SA}}$ formed by the clock generator $T_2$ as is obvious from FIGS. 3B and 4B. In the internal address signal generator $T_4'$, the internal address signals $a_{xi}$, $a_{xi}$ are generated from the address signal $A_{xi}$ from outside the memory chip as is obvious from FIG. 6.

First of all, the $\overline{RAS}$ signal is set to the Low level at the time $t_0$ and the predetermined row address from outside the memory chip is taken into the memory chip by the row address buffer XAB so as to drive the corresponding word line. In this case, the memory cells $MC_{00}$, $MC_{01}$, $MC_{02}$ and $MC_{03}$ selected. At this time the data line precharge signal $\overline{\phi_{PC}}$ to the Low level before the word line is driven and turns OFF the data line precharge circuit. Next, the sense amplifier driving signals $\phi SA'$, $\overline{\phi_{SA'}}$ are at the High and Low levels, respectively, and the signals from the memory cells are amplified by the sense amplifiers $SA_0 \sim SA_3$. Next, the $\overline{WE}$ and $\overline{CAS}$ signals are set to the Low levels. When the $\overline{WE}$ signal changes to the Low level, the common data line I/0 and the amplifier MA are separated in response to the former while the common data line I/0 and the data input buffer DiB are connected. At this time, therefore, the data $D_i$ (the predetermined data for erasing the storage data) inputted to the data input buffer DiB is transferred to the common data line.

On the other hand, when the $\overline{CAS}$ signal changes to the Low level, the column system address is taken into the memory chip through the column address buffer YAB and one of the column decoder output lines $Y_0 \sim Y_3$ is driven in response to the former. It will be assumed hereby that $Y_0$ is driven. Therefore, the predetermined data for erasing the storage data is written into the memory cell $MC_{00}$. Thereafter, the $\overline{WE}$ and $\overline{CAS}$ signals change to the High level, respectively, while the column decoder output line $Y_0$ changes from the High level to the Low level. Thus, the write operation into the memory cell $MC_{00}$ is complete. Next, the $\overline{WE}$ and $\overline{CAS}$ signals are changed once again to the Low level and the same operation as described above is carried out to drive the column decoder output line $Y_1$. In this manner the predetermined data for erasing the storage data is written into the memory cell $MC_{01}$. This operation is repeated until finally the predetermined data for erasing the storage data are written into the memory cells $MC_{00}$, $MC_{01}$, $MC_{02}$, $MC_{03}$. Thereafter, the $\overline{CAS}$ and $\overline{WE}$ signals are changed to the High level with all the column decoder output lines being set to the Low level so that the common data line I/0 and the data input buffer DiB are separated while the common data line I/0 and the amplifier MA are connected. Next, the $\overline{RAS}$ signal is changed to the High level while the word line $W_0$ is changed to the Low level so as to store the predetermined data for erasing the storage data in the memory cells $MC_{00}$, $MC_{01}$, $MC_{02}$, $MC_{03}$. Thereafter the sense amplifier driving signals $\phi_{SA'}$, $\overline{\phi_{SA'}}$ are set to the Low and High levels, respectively while the sense amplifier is turned OFF. The data line precharge signal $\overline{\phi_{PC}}$ is set to the High level and the data line is precharged to $\frac{1}{2} V_{cc}$ ($=V_{DP}$) which is half the power source voltage $V_{cc}$ to enter the stand-by state.

Next, the operation in the period $t_1 \sim t_2$ shown in FIG. 7 will be described. In this period the control signal $\phi_{CLM}$ for erasing the storage data changes to the High level. When the $\phi_{CLM}$ signal changes from the Low level to the High level, the counter circuit AC which generates the address signal inside the memory chip is set in such a manner as to generate the address signal which selected the word line (here, $W_0$) that is selected in the page mode in accordance with the rise of the $\phi_{CLM}$ signal. In other words, when the $\phi_{CLM}$ signal is applied to the node C in the circuit shown in FIG. 5A, the potential of the node $N_1$ (power source voltage level or the ground level) is inputted through the transistor $M_1$ for a predetermined period from the rise (here, till the rise of the row control signal $\phi_R$). This input potential appears at the output node Q and becomes the address signal. Therefore, the address signal is set by setting the node $N_1$ of the circuit of $F_0 \sim F_3$ at a predetermined potential (power source voltage level or ground level).

Thereafter, when the $\overline{RAS}$ signal changes to the Low level and the row control signal $\phi_R$ changes to the High level, the output of the counter circuit AC is held. At this time, since the $\phi_{CLM}$ signal is at the High level, the internal address signal generator $T_4'$ generates the internal address signal $a_{xi'}$ $\overline{a_{xi}}$ corresponding to the address signal $A_{xi}'$ generated inside the chip as shown in FIG. 6. Therefore, the word line (here, $W_0$) selected and driven in the page mode is selected. Thereafter the word line driving signal $\phi_x$ changes to the High level and drives the selected word line. At this time the data line precharge signal $\phi_{PC'}$ changes to the Low level before driving of the word line and turns OFF the data line precharge circuit. This state is held until the erasing operation is complete by the circuit $L_1$ (until the erasing operation control signal $\phi_{CLM}$ changes to the Low level).

This can be attained, too, by use of the circuit and the control signal $\phi_{CLM}$ for erasing the storage data shown in FIG. 2B. When the data line precharge signal $\overline{\phi_{PC'}}$ changes to the Low level and the word line $W_0$ is driven, the data of the memory cells $MC_{00}$, $MC_{01}$, $MC_{02}$, $MC_{03}$ (the data for erasing that are written in the previous page mode operation) are read out on the respective data lines.

Thereafter the sense amplifier driving signals $\phi_{SA'}$, $\overline{\phi_{SA'}}$ change to the High level and the Low level, respectively, drive the sense amplifiers and amplify the data for erasing. This state is held until the erasing operation is completed by the circuits $L_2$, $L_3$ (until the control signal for erasing the storage data changes to the Low level). This can be attained, too, by the circuit and the control signal $\phi_{CLM}$ for erasing the storage data shown in FIGS. 3A and 4A. Therefore, the data for erasing is held for a period in which each sense amplifier effects the erasing operation.

When the $\overline{RAS}$ signal changes to the High level under the state described above, the word line $W_0$ changes to the Low level and the data for the erasing operation are stored in the memory cells $MC_{00}$, $MC_{01}$, $MC_{02}$ and $MC_{03}$. Since the $\phi_{CLM}$ signal is at the High level at this time, the data line precharge signal $\overline{\phi_{PC}}$, and the sense amplifier driving signals $\overline{\phi_{SA'}}$, $\phi_{SA'}$ irrelevant to the change of the input signals $\overline{\phi_{PC}}$, $\phi_{SA}$, $\overline{\phi_{SA}}$ as shown in FIGS. 2B, 3A and 4A. On the other hand, the row control signal $\phi_R$ changes to the Low level in the counter circuit AC for generating the address signal inside the memory chip as shown in FIG. 5A, the address is counted up by one. This address signal is transferred to the internal address signal generator $T_{4'}$. Since the $\phi_{CLM}$ signal is at the High level in this generator $T_{4'}$, the generator outputs the internal address signals $a_{xi}$, $\overline{a_{xi}}$ corresponding to the address signal $A_{xi}$, generated inside the memory chip, as shown in FIG. 6A. Accordingly, the word line (here, $W_1$) which is to be selected after the word line $W_0$ is selected.

When the $\overline{RAS}$ signal changes thereafter to the Low level, the row control signal $\phi_R$ changes to the High level and the counter circuit holds the address signal described above as shown in FIG. 5B. Next, the word line driving signal $\phi_x$ changes to the High level and drives the selected word line $W_1$ to select the memory cells $MC_{10}$, $MC_{11}$, $MC_{12}$, $MC_{13}$. Therefore, the data for erasing the storage data that are held by the sense amplifiers are written into the memory cells $MC_{10}$, $MC_{11}$, $MC_{12}$, $MC_{13}$. Incidentally, since the $\phi_{CLM}$ signal is at the High level at this time, the data line precharge signal $\overline{\phi_{PC'}}$ the sense amplifier driving signals $\overline{\phi_{SA'}}$, $\phi_{SA'}$ are irrelevant to the change of the $\overline{\phi_{PC}}$, $\phi_{SA}$ and $\overline{\phi_{SA}}$ signals. Thereafter, the $\overline{RAS}$ signal changes to the High level while the $\phi_R$ signal and $\phi_x$ signal change to the Low level and the potential of the word line $W_1$ is set to the Low level. Accordingly, the data for erasing are stored in the memory cells $MC_{10}$, $MC_{11}$, $MC_{12}$, $MC_{13}$. Since the $\phi_R$ signal changes to the Low level, the counter circuit AC counts up and advances the address by one. The operations described above are repeated until the data for erasing the storage data are written into all the memory cells.

Incidentally, the ordinary operation is carried out when the control signal $\phi_{CLM}$ for erasing the storage data changes to the Low level. In other words, the circuit $L_1$ which controls the data line precharge signal $\overline{\phi_{PC'}}$ outputs the $\overline{\phi_{PC}}$ signal, which is generated in response to the $\overline{RAS}$ signal, as such, as the data line precharge signal $\overline{\phi_{PC'}}$ because the $\phi_{CLM}$ signal changes to the Low level as shown in FIG. 2B. The circuits $L_2$, $L_3$ for controlling the sense amplifier driving signals $\phi_{SA'}$, $\overline{\phi_{SA'}}$ output as such the $\phi_{SA}$, $\overline{\phi_{SA}}$ signals, that are generated in response to the $\overline{RAS}$ signal, as $\phi_{SA'}$ and $\overline{\phi_{SA'}}$. Since the $\phi_{CLM}$ signal changes to the Low level as shown in FIG. 6, the internal address signal generator $T_{4'}$ outputs the internal address signals $a_{xi}$, $\overline{a_{xi}}$ in response to the address signal $A_{xi}$ from outside the memory chip.

In accordance with the present invention described above, the memory cell data can be erased in the unit of the memory cell number connected to the word lines so that erasing time can be shortened remarkably. In other words, when an m-row by n-column memory cell array is to be erased in a cycle time $t_{RC}$, the prior art method needs a time $m \times n \times t_{RC}$ whereas the present invention needs only a time $(m+n)t_{RC}$. Therefore, the use efficiency of the computer can be improved remarkably.

Incidentally, the row system address signal necessary for the erasing operation can be generated by use of a counter for generating the address signal inside the memory chip for the refreshing operation of the memory. It is also possible to apply the row system address signal from outside the memory chip instead of generating the row system address signal inside the memory chip. The control signal $\phi_{CLM}$ for erasing the storage data inputted from outside the memory chip can be generated inside the chip by disposing a circuit for sensing the combination of timing of the $\overline{RAS}$ signal, the $\overline{CAS}$ signal, the $\overline{WE}$ signal and the address signal Ai.

(SECOND EMBODIMENT)

The second embodiment of the present invention will now be described with reference to FIG. 8.

Figure 8:
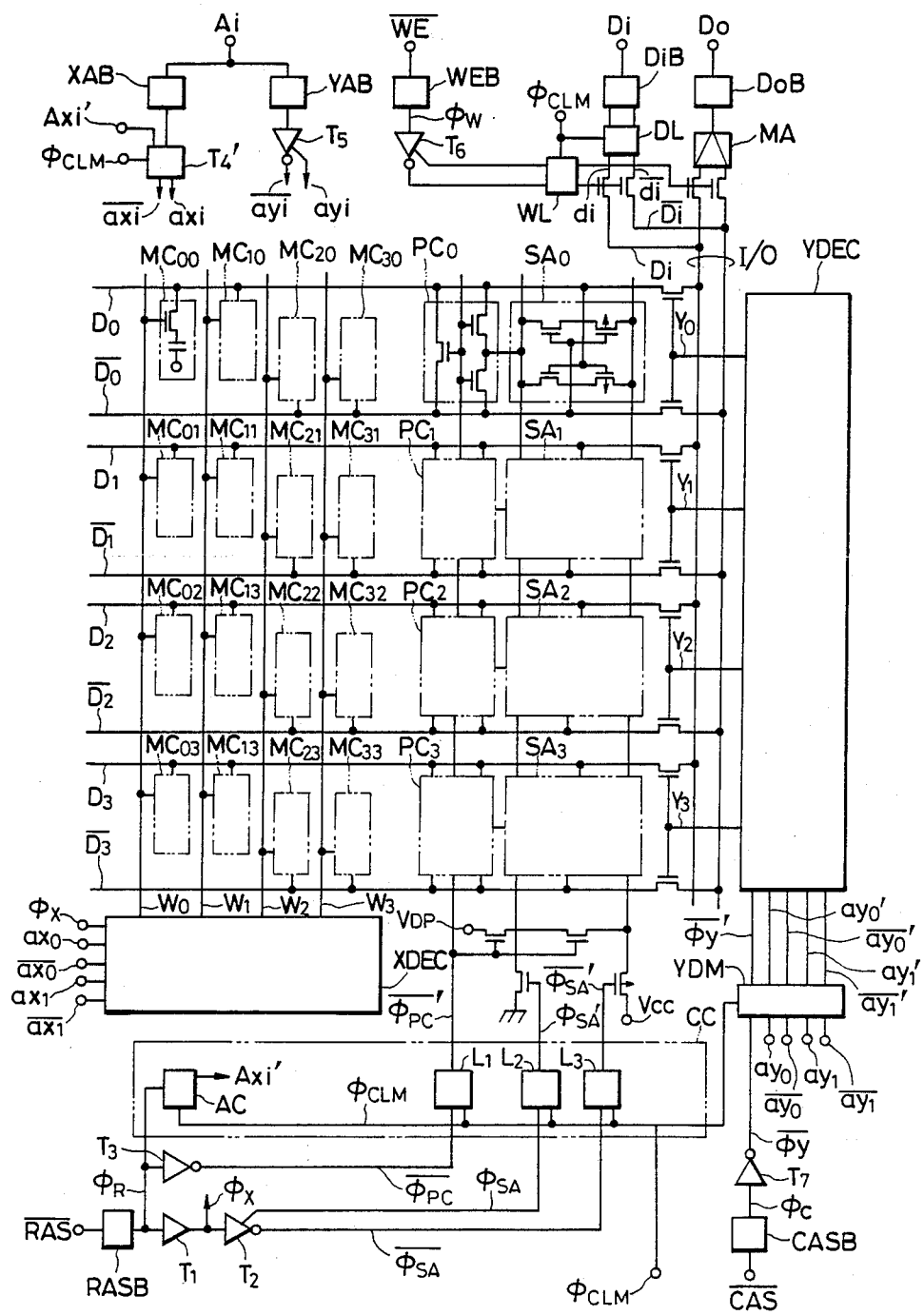
FIGS. 8 to 12 show a second embodiment of the present invention.
Figure 10:
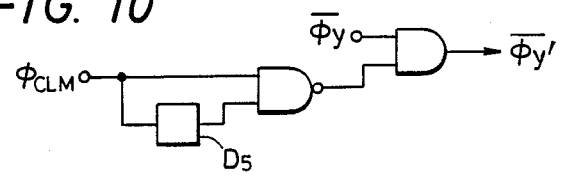
Figure 11A:
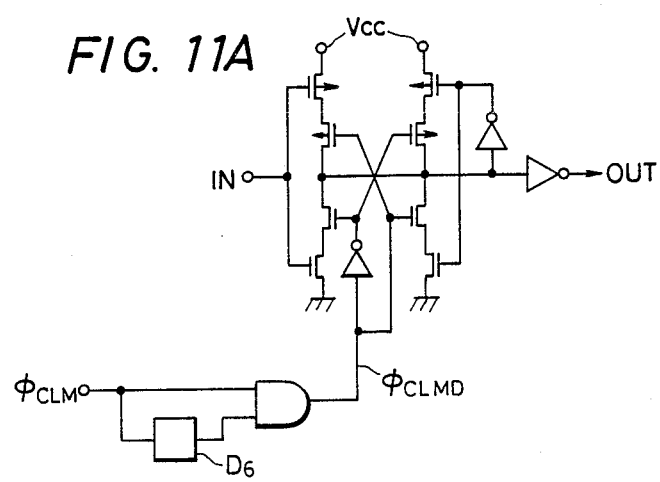
Figure 11B:
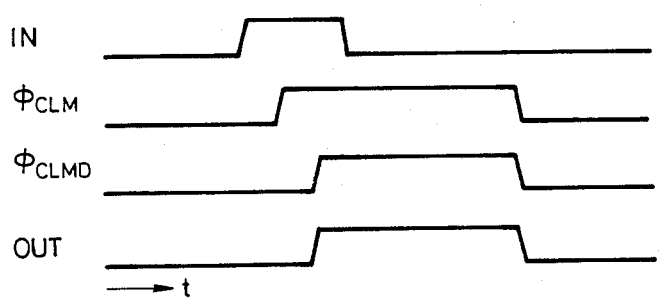

The circuit of this embodiment shown in FIG. 8 is different from the first embodiment shown in FIG. 2A in that a control circuit for column decoder input signals YDM which controls the input signals to the column decoder, an input data holding circuit DL which holds the signal from the data input buffer and an internal write control signal holding circuit WL which holds the signals from the $\overline{WE}$ buffer circuit are added anew. The control circuit YDM is a circuit for the multi-selection of data lines (and sets all the column decoder output lines $Y_0 \sim Y_3$ to the High level). The column address signals $a_{y0}$, $\overline{a_{y0}}$, $a_{y1}$, $\overline{a_{y1}}$ are controlled by the circuit shown in FIG. 9 while the column decoder output line driving signal $\overline{\phi_y}$ is controlled by the circuit shown in FIG. 10. The circuit shown in FIG. 11A is used as DL and WL. When the circuit is used as the DL circuit, IN in the drawing is connected to the data input buffer DiB while OUT is connected to the common data line. When the circuit is used as the WL circuit, IN is connected to the clock generator $T_6$ while OUT is connected to the transfer gate for controlling the common data line. In the drawing, $D_6$ represents a delay circuit which is the same as the one shown in FIG. 2B. FIG. 11B shows operating waveforms for illustrating the outline of the operation.

Figure 12:
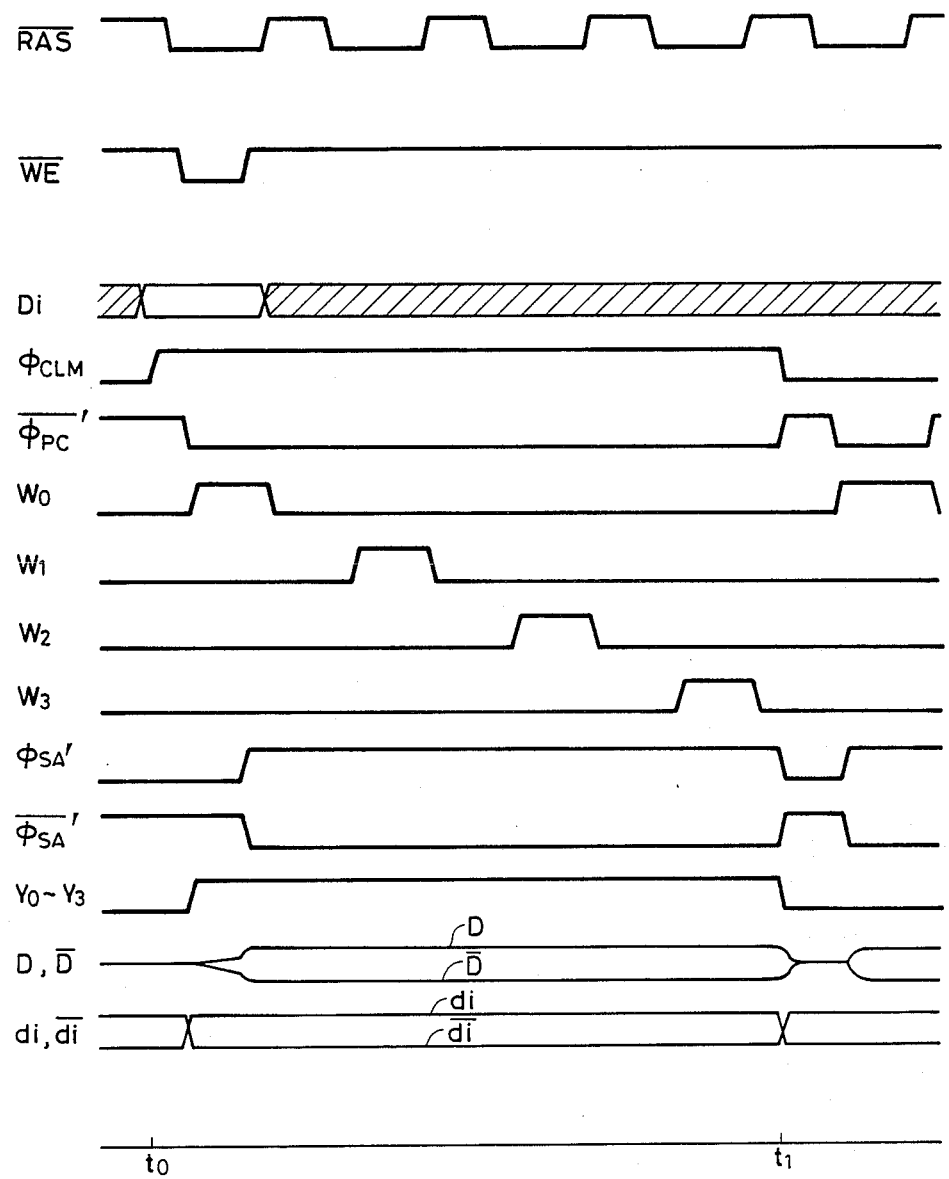

The operation of the embodiment shown in FIG. 8 will be described with reference to the operating waveforms shown in FIG. 12. When the control signal $\phi_{CLM}$ for erasing the storage data changes from the Low level to the High level, the counter circuit AC is set to the predetermined state in the same way as in the first embodiment. On the other hand, the $\overline{RAS}$ signal and the $\overline{WE}$ signal thereafter changes to the Low level. Therefore, the input data (the data for erasing) is taken into the memory chip and held by the circuit DL. As can be seen clearly from FIGS. 11A and 11B, the input data is held while the $\phi_{CLM}$ signal is at the High level. Since the $\overline{WE}$ signal changes to the Low level, the amplifier MA and the common data line I/0 are separated while the circuit DL for holding the input data and the common data line are connected. This state is held while the $\phi_{CLM}$ signal is at the High level as is obvious from FIGS. 11A and 11B. Therefore, the input data is transferred to the common data line.

Figure 9:
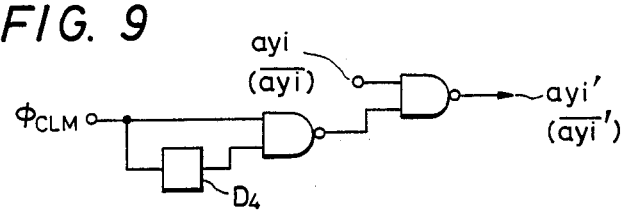

Next, when the $\phi_{CLM}$ signal changes to the High level, all the column address signals are at the High level while the $\phi_{CLM}$ signal is at the High level as is obvious from FIG. 9. The column decoder output line driving signal $\overline{\phi_y}$ is at the Low level while the $\phi_{CLM}$ signal is at the High level as is obvious from FIG. 10. Therefore, all the column decoder output lines are at the High level, all the data lines are connected to the common data line and the predetermined data for erasing the storage data are transferred to all the data lines. On the other hand, since the $\overline{RAS}$ signal has already changed to the Low level, the data line precharge signal $\overline{\phi_{PC}}$ changes first to the Low level before the erasing data are written into all the data lines. Thereafter, the word line driving signal $\phi_x$ changes to the High level and the word line selected by the address signal generated by the counter AC is driven. (W$_0$ is hereby assumed to be driven.)

After the predetermined data for erasing the storage data are written into all the data lines, the sense amplifier driving signals $\phi_{SA'}$, $\overline{\phi_{SA'}}$ change to the High and Low levels, respectively, and amplify the predetermined data for erasing the storage data. Accordingly, the erasing data are written into the memory cells MC$_{00}$, MC$_{01}$, MC$_{02}$ and MC$_{03}$. In the same way as in the first embodiment, this state is held by the data line precharge signal $\overline{\phi_{PC}}$, the sense amplifier driving signals $\phi_{SA'}$, $\overline{\phi_{SA'}}$ due to the $\phi_{CLM}$ signal while the $\phi_{CLM}$ signal is at the High level. Thereafter, the $\overline{RAS}$ signal changes to the High level, the word line driving signal $\phi_x$ changes to the Low level and the level of the word line W$_0$ changes to the Low. Therefore, the predetermined data for erasing the storage data are stored in the memory cells MC$_{00}$, MC$_{02}$, MC$_{03}$. Thereafter, the change of the $\overline{RAS}$ signal is repeated in the same way as in the first embodiment so that the predetermined data for erasing the storage data are written into all the memory cells.

In the first embodiment, the predetermined data for erasing the storage data is first written into the predetermined memory cell in the page mode, whereas in this second embodiment the column decoder is set to the multi-selection state so that the predetermined data for erasing the storage data are written simultaneously into all the data lines and held by the sense amplifiers and the erasing time can therefore be further reduced. In other words, when the mrow by n-column memory array is erased in the cycle time $t_{RC}$, this embodiment can make the erasing operation substantially within the time m$\times t_{RC}$. Therefore, the efficiency of use of the computer can be further improved. Though this second embodiment uses the $\overline{WE}$ signal for controlling the connection between the common data line and the amplifier MA and between the common data line and the input data holding circuit DL, it may be made by use of only the $\phi_{CLM}$ signal. Though the counter circuit is set initially by the $\phi_{CLM}$ signal, initial setting is not particularly necessary in this embodiment.

(THIRD EMBODIMENT)

The third embodiment of the present invention will be described with reference to FIG. 13.

In the second embodiment described above, multi-selection of the column decoder is made by setting all the column system internal address signals to the High level and the column decoder output line driving signal $\overline{\phi_y}$ to the Low level while the control signal $\phi_{CLM}$ for erasing storage data is at the High level. However, multi-selection of the column decoder can be made by use of the circuit construction such as shown in FIG. 13.

Figure 13:
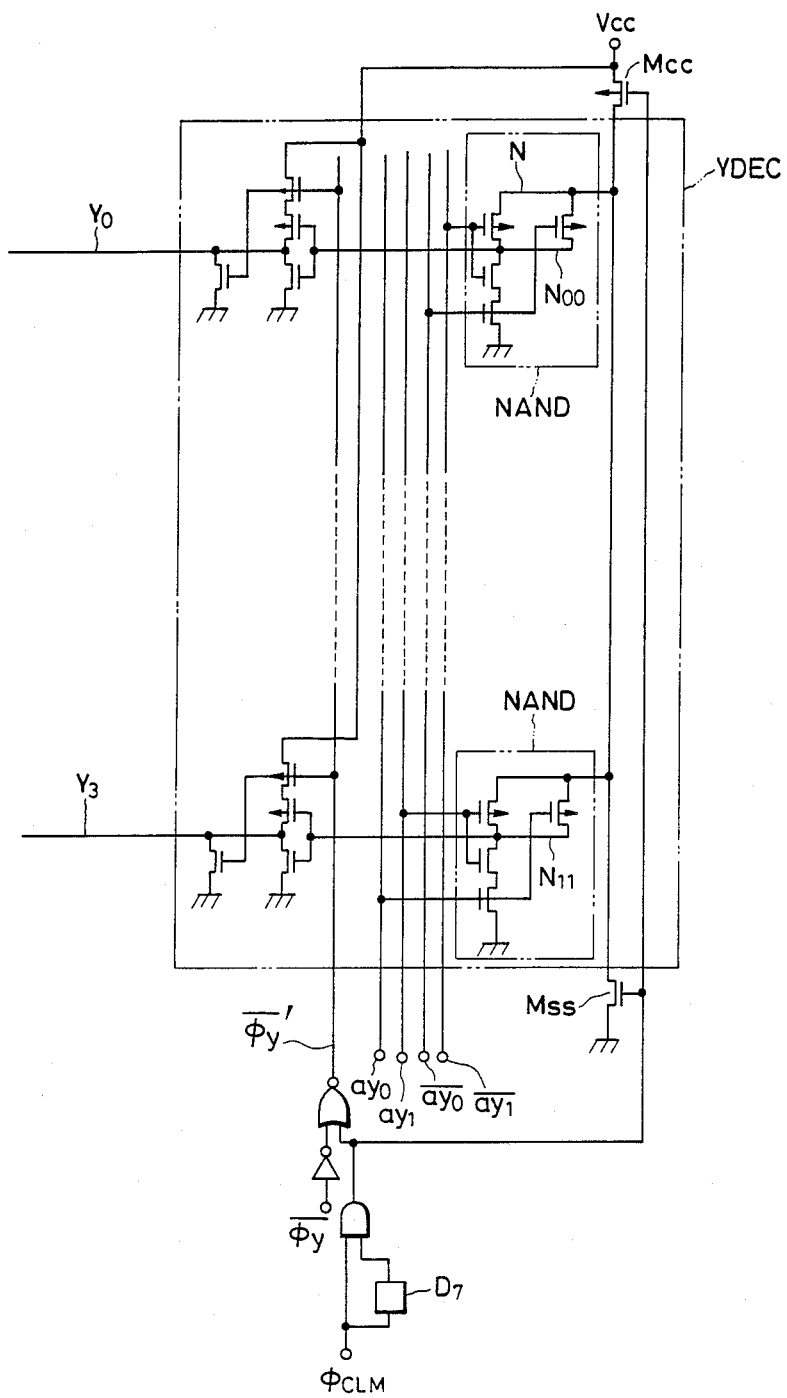
FIG. 13 shows a third embodiment of the present invention.

FIG. 13 shows the column decoder in this embodiment. In the drawing, the nodes N of all the NAND circuits, on the power source side (V$_{cc}$), to which the column system address signals a$_{y0}$, $\overline{a_{y0}}$, a$_{y1}$, $\overline{a_{y1}}$ are applied are connected to the power source line (V$_{cc}$) through a common MOSFET Mcc and connected to a ground node through Mss. Furthermore, the gates of these MOSFETs are controlled by the $\phi_{CLM}$ signal. The $\overline{\phi_y}$ signal is inputted to the column decoder through a log gate which is at the Low level while the $\phi_{CLM}$ signal is at the High level. In FIG. 13, symbol D$_7$ represents a delay circuit which is analogous to the delay circuit shown in FIG. 2B.

Multi-selection of the column decoder in this circuit is made in the following way. It will be hereby assumed that the column system address signals a$_{y0}$, a$_{y1}$ are at the High level and $\overline{a_{y0}}$, $\overline{a_{y1}}$ are at the Low level. In this case, the node N$_{11}$ as the output node of the NAND circuit is at the low level, at least one gate of PMOS in the other NAND circuits is at the low level and the output of that NAND circuit is at the High level. At this time, if the $\phi_{CLM}$ signal changes to the High level (the erasing operation), the potential of the node N on the power source (V$_{cc}$) side of the NAND circuit is at the ground potential level. Therefore, the outputs of all the NAND circuit change to the Low level. On the other hand, the column decoder output put line driving signals $\overline{\phi_{y'}}$ change to the Low level with the change of the $\phi_{CLM}$ signal to the High level. Therefore, all the column decoder output lines (Y$_0 \sim$ Y$_3$) change to the High level and the column decoder enters the multi-selection state.

As described above, this embodiment can further reduce the number of additional circuits in comparison with the second embodiment and the erasing time is substantially equal to that of the second embodiment.

Though the level of the node of the NAND circuit on the power source (V$_{cc}$) side is controlled for the purpose of multi-selection in this embodiment, it is also possible to employ a circuit system wherein MOSFET receiving the input $\phi_{CLM}$ signal at its gate is connected to the output node of each NAND circuit so as to compulsively set the output node of the NAND circuit to the Low level when the $\phi_{CLM}$ signal changes to the High level. (Fourth embodiment)

Figure 14:
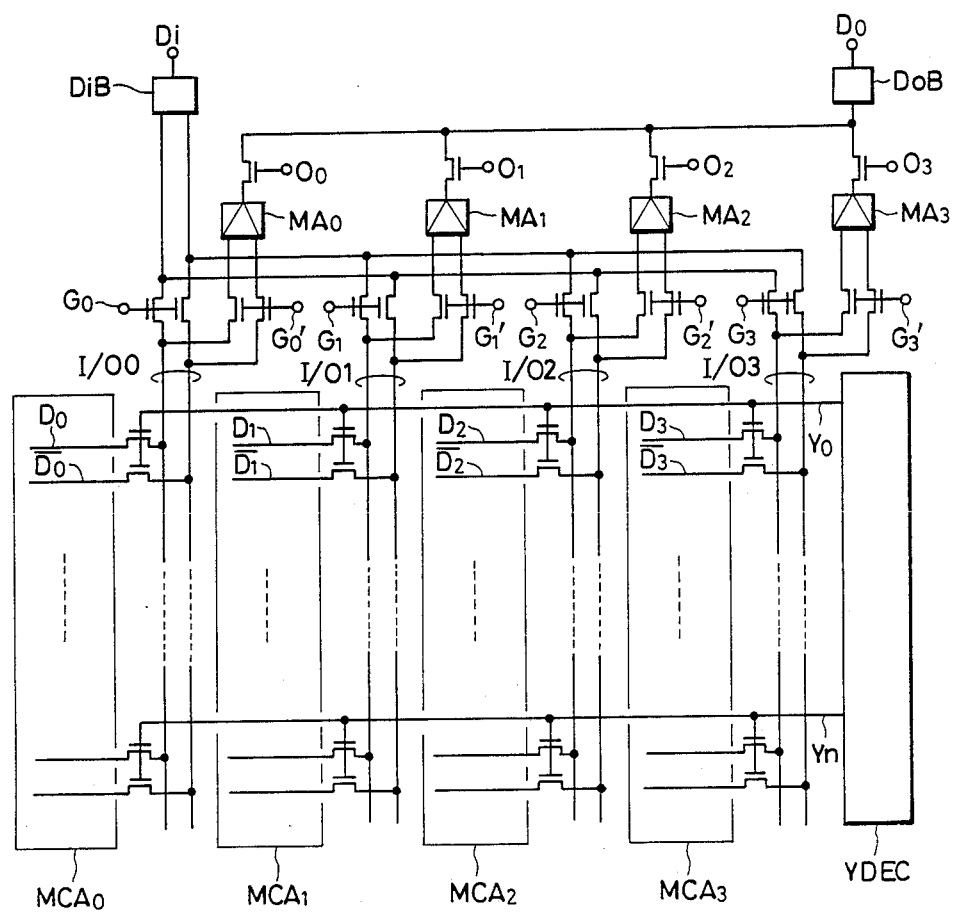
FIG. 14 shows a fourth embodiment of the present invention.

The fourth embodiment of the present invention will be described with reference to FIG. 14. This drawing illustrates an array construction when the memory array of the first embodiment, for example, is divided into a large number of units (four units in this case). In the drawing, symbols MCA$_0$, MCA$_1$, MCA$_2$ and MCA$_3$ represent the memory arrays, and a data input buffer DiB is connected to common data lines I/O$_0$, I/O$_1$, I/O$_2$ and I/O$_3$ through transfer gates that are controlled by signals G$_0$, G$_1$, G$_2$ and G$_3$, respectively. The common data lines are connected to amplifiers MA$_0$, MA$_1$, MA$_2$ and MA$_3$ through transfer gates that are controlled by signals G$_0'$, G$_1'$, G$_2'$ and G$_3'$, respectively. The output nodes of these amplifiers are connected to a data output buffer DOB through transfer gates that are controlled by signals O$_0$, O$_1$, O$_2$ and O$_3$.

The operation of the memory arrays is carried out normally in the following way. In the data write cycle, after the input data is applied to the data input buffer DiB, one of the signals G$_0$, G$_1$, G$_2$ and G$_3$ is at the High level. It will be hereby assumed that the signal G$_0$ is at the High level. In this case the data input buffer DiB and the common data line I/O$_0$ are connected. The input data is written into the memory cell inside the sub-memory cell array MCA$_0$. In the read cycle, the data read out from the memory cell is read out on a pair of the four common data line pairs. It will be assumed hereby that the memory cell data is read out on the common data line pair I/O$_0$. Next, the G$_0'$ signal changes to the High level and the common data line I/O$_0$ and the amplifier MA$_0$ are connected and the read data from the memory cell is amplified by the amplifier. Then, the O$_0$ signal changes to the High level and the amplified signal is transferred to the data output buffer and turns to the output data D$_0$.

When the erasing operation is made in accordance with the array construction described above, it must be effected sequentially for each of the divided sub-arrays (MCA$_0$, MCA$_1$, MCA$_2$, MCA$_3$). However, the erasing operation can be made simultaneously in all of the four sub-arrays by controlling the G$_0$, G$_1$, G$_2$ and G$_3$ signals by use of the control signal $\phi_{CLM}$ for erasing the storage data. In other words, while the $\phi_{CLM}$ signal is at the High level, the G$_0$, G$_1$, G$_2$ and G$_3$ signals are set to the High level so that the erasing data are written into all the four common data line pairs. Thereafter, the levels of the column decoder output lines Y$_0$~Y$_n$ are set sequentially to the High level by the page mode operation in the same way as in the first embodiment and the predetermined data for erasing the storage data is written into the memory cell connected to the word line that is selected by the predetermined address signal, for each sub-array. Next, the data of all the memory cells are erased in the same way as in the first embodiment.

As described above, since this embodiment can simultaneously make the erasing operation in each of the divided sub-arrays, the erasing time can be shortened and the efficiency of use of the computer can be improved.

(FIFTH EMBODIMENT)

Figure 15:
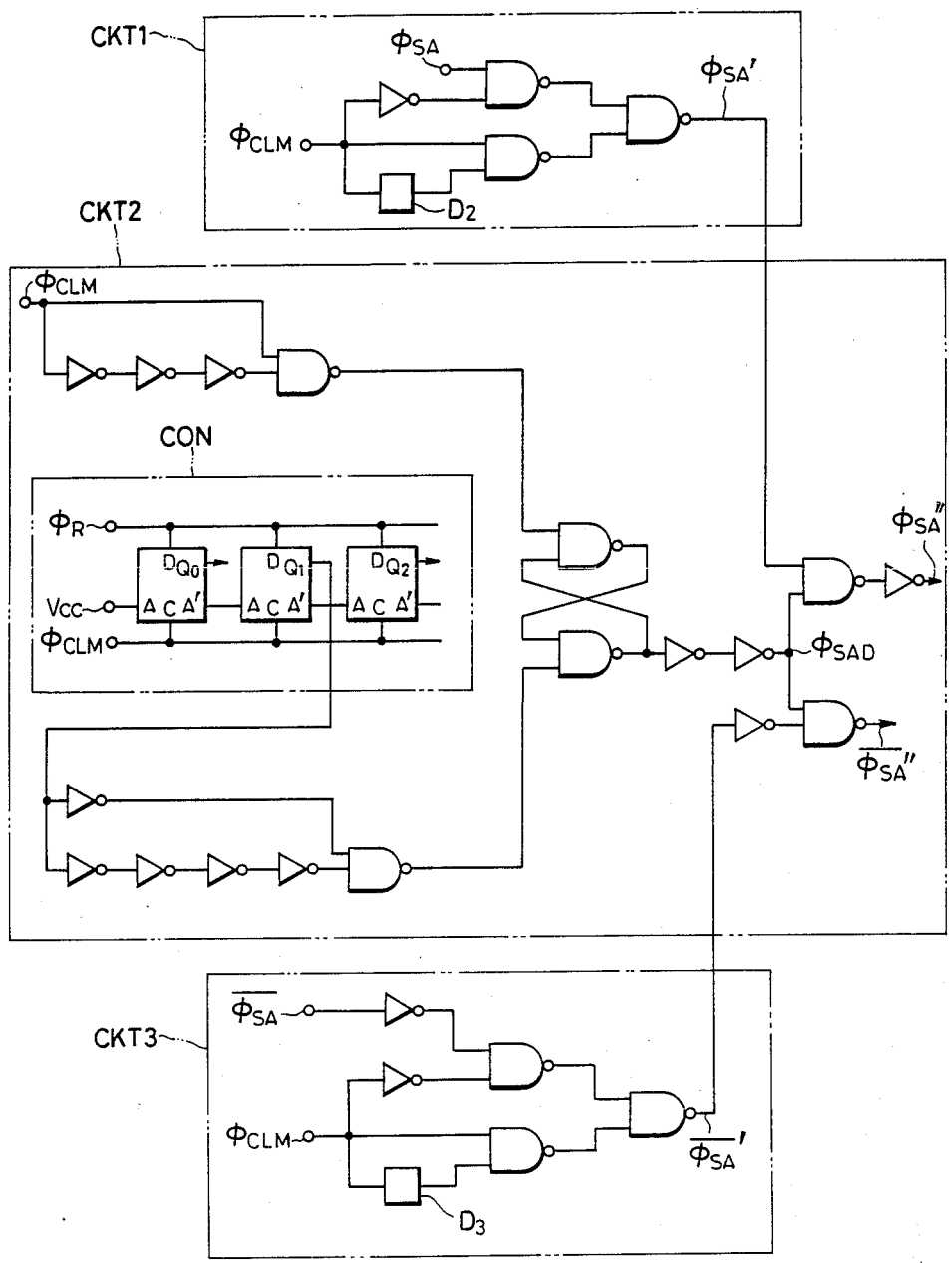
FIGS. 15 and 16 show a fifth embodiment of the present invention.

The fifth embodiment of the present invention will be described with reference to FIG. 15. In the afore-mentioned second and third embodiments, the predetermined data for erasing the storage data are written into all the data lines by the multi-selection of the column decoder through the common data lines I/0. The erasing data thus written into the data lines are held by thereafter operating the sense amplifiers. If the memories are integrated in a high integration density, the number of data lines into which the predetermined data for erasing the storage data increases and the writing time will naturally increase. Therefore, it will be necessary to operate the sense amplifiers for holding the predetermined data for erasing the storage data after the passage of a sufficient time from multi-selection of the column decoder. This can be accomplished by adding a circuit such as shown in FIG. 15 that delays the sense amplifier operation start time. In FIG. 15, symbols CKT1, CKT3 are sense amplifier driving signal ($\phi_{SA}'$, $\overline{\phi_{SA}'}$) generator and CKT2 represents a circuit that delays the generation timing, of the sense amplifier driving signal when the control signal $\phi_{CLM}$ for erasing the storage data is inputted. Symbol CON in CKT2 represents a counting circuit for counting the number of operation cycles of the memory for setting the delay time of the sense amplifier driving signal. This circuit can be accomplished by use of the counter circuit such as shown in FIG. 5.

Figure 16:
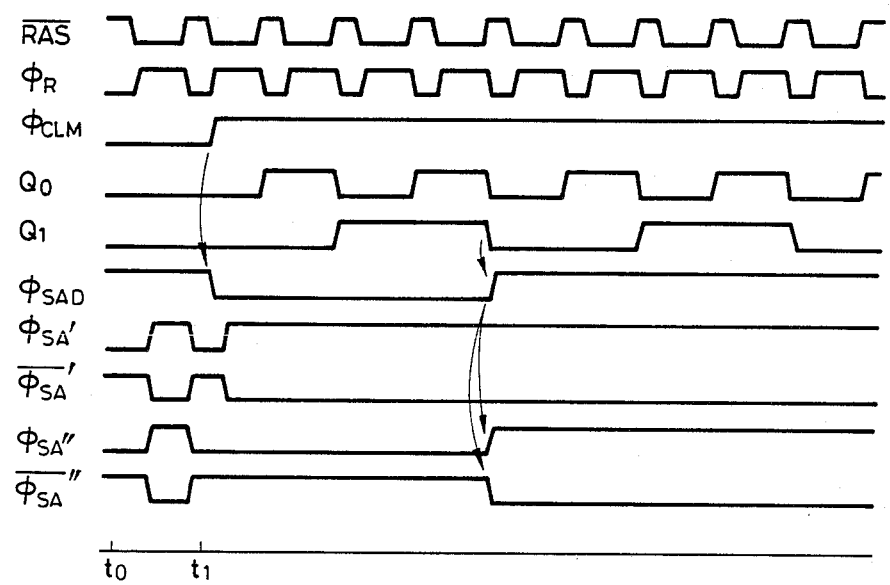

The operation of the circuit shown in FIG. 15 will be explained with reference to the operating waveforms shown FIG. 16 In the normal operation period t$_0$~t$_1$, the signal $\phi_{SAD}$ is at the High level so that the sense amplifier driving signals $\phi_{SA}'$ and $\overline{\phi_{SA}'}$ generated by CKT1 and CKT3 are outputted as such and drive the sense amplifiers as $\phi_{SA}''$ and $\overline{\phi_{SA}''}$, respectively. In the erasing mode after the time t$_1$, the signal $\phi_{CLM}$ first changes to the High level so that $\phi_{SAD}$ changes to the Low level. In the counter circuit CON at this time, the node N$_1$ shown in FIG. 5A is kept at the ground potential level (Low level) so that Q$_0$, Q$_1$ and Q$_2$ are at the Low level. Thereafter this counter circuit counts up whenever $\phi_R$ changes to the Low level. In the circuit shown in FIG. 15, $\phi_{SAD}$ is controlled by Q$_1$. Therefore, after the passage of the four cycles $\phi_{SAD}$ is set to the High level. Therefore, in the period of the four cycles from the change of $\phi_{CLM}$ to the High level, $\phi_{SAD}$ is held at the Low level so that $\phi_{SA}''$ and $\overline{\phi_{SA}''}$ keep the Low and High levels, respectively. In other words, the sense amplifiers do not operate in the four cycles described above and the erasing data can be written from the common data lines to all the data lines. When $\phi_{SAD}$ changes to the High level, $\overline{\phi_{SA}''}$ is controlled by $\phi_{SA}'$ while $\overline{\phi_{SA}''}$ is controlled by $\overline{\phi_{SA}'}$ so that $\phi_{SA}''$ changes to the High level while $\overline{\phi_{SA}''}$ changes to the Low level, and keep the respective levels while $\phi_{CLM}$ is at the High level. In other words, the sense amplifiers operate and hold the predetermined data for erasing the storage data.

In accordance with the embodiment described above, it becomes possible to retard the operation timing of the sense amplifiers by a predetermined time after receipt of the control signal for erasing the storage data, and a sufficient write time for writing the predetermined data for erasing the storage data can be secured even in a high integration density memory. Thus, the possibility that wrong erasing data is written can be eliminated. Since the delay time of the operation timing of the sense amplifiers is set by the number of operation cycles of the memory, it can be handled easily by the users of the memory. Namely, in order to make the erasing operation, only the cycle number described above and the cycle number for raising all the word lines to the High level need be taken into consideration.

(SIXTH EMBODIMENT)

The sixth embodiment of the present invention will be described with reference to FIG. 17. The first to fifth embodiments of the invention illustrate the case where the predetermined data for erasing the storage data are taken into the memory chip through the data input buffer and written through the common data lines. Where the erasing data described above are determined by the combination of external timing pulses inputted to the memory (e.g. the refresh operation is determined by the timing $\overline{CAS}$ before $\overline{RAS}$), the erasing data can be written into the data lines by the circuit construction shown in FIG. 17.

Figure 17:
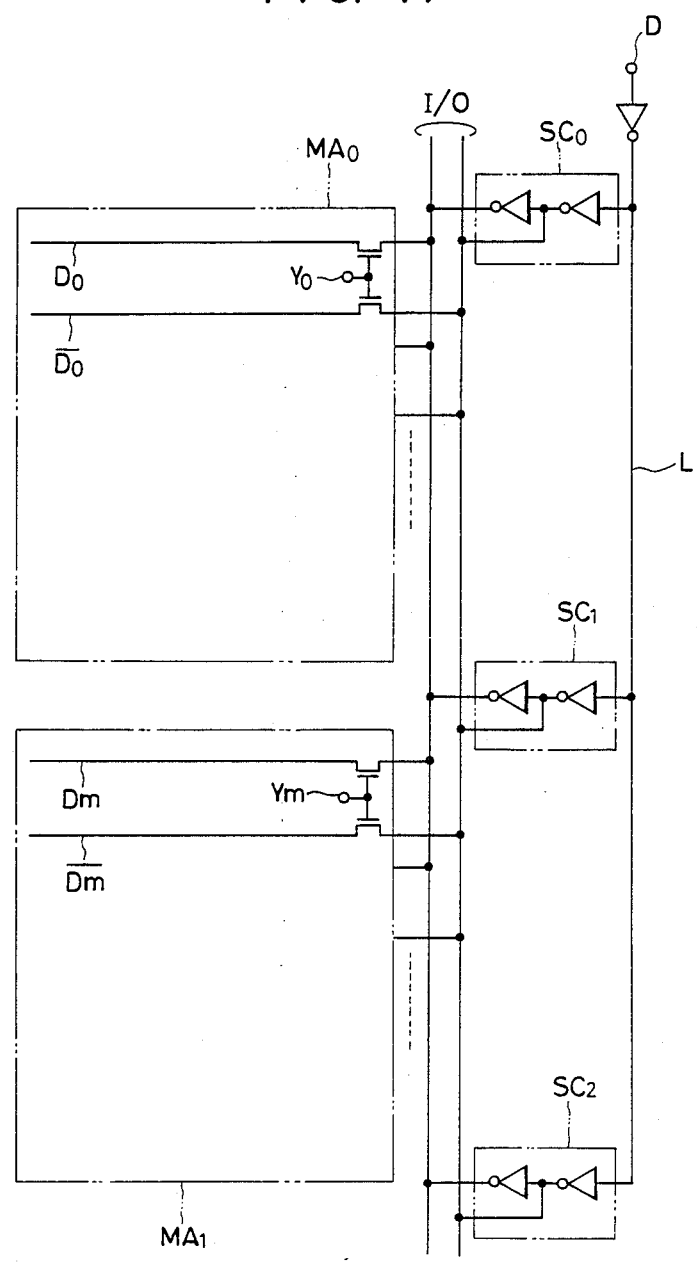
FIGS. 17, 18A and 18B show a sixth embodiment of the present invention.

In FIG. 17, $MA_0$ and $MA_1$ are memory arrays, $D_0$, $\overline{D_0}$, $D_m$ and $\overline{D_m}$ are data lines, I/0 is a common data line and $SC_0$, $SC_1$ and $SC_2$ are data set circuits for erasing the storage data. These data set circuits are arranged dispersedly relative to the memory arrays as shown in the drawing. $Y_0$ and $Y_m$ are output signal input nodes of the column decoder and D is the erasing data input node.

The operation of the circuit shown in FIG. 17 is as follows. In the erasing operation mode, all the output signals ($Y_0$, $Y_m$) of the column decoder change to the High level as described in the second embodiment and the data lines ($D_0$, $\overline{D_0}$, $D_m$, $\overline{D_m}$) and the common data lines (I/0) are connected. At this time the erasing data is inputted to the node D. This erasing data is transferred to the erasing data set circuits $SC_0$, $SC_1$, $SC_2$ through the signal line L and written into the data lines through the common data lines I/0. The subsequent operations are carried out in the same way as in the second embodiment.

In accordance with this embodiment the erasing data are written by the erasing data set circuit, and can therefore make the erasing operation even when the erasing data are determined by the combination of the external timing pulses. Since the erasing data set circuits are arranged dispersedly, the data can be written quickly even when the memories are integrated in a high integration density and the number of data lines for writing the erasing data increases. Therefore, the erasing time can be reduced.

Figure 18A:
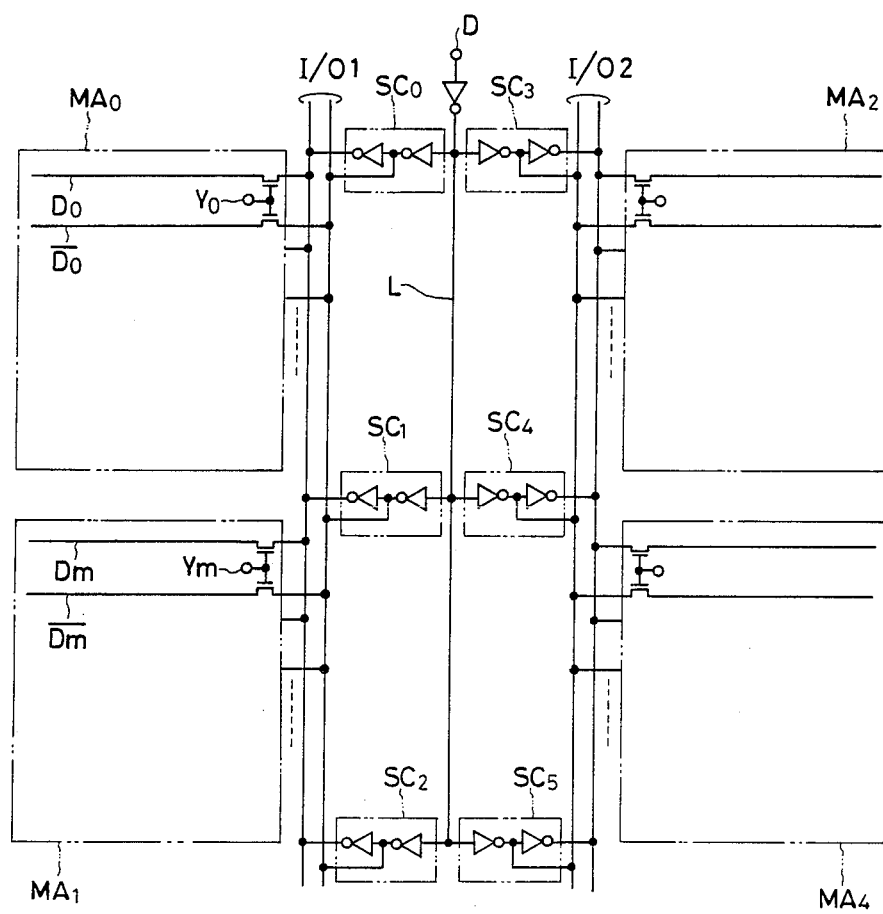
Figure 18B:
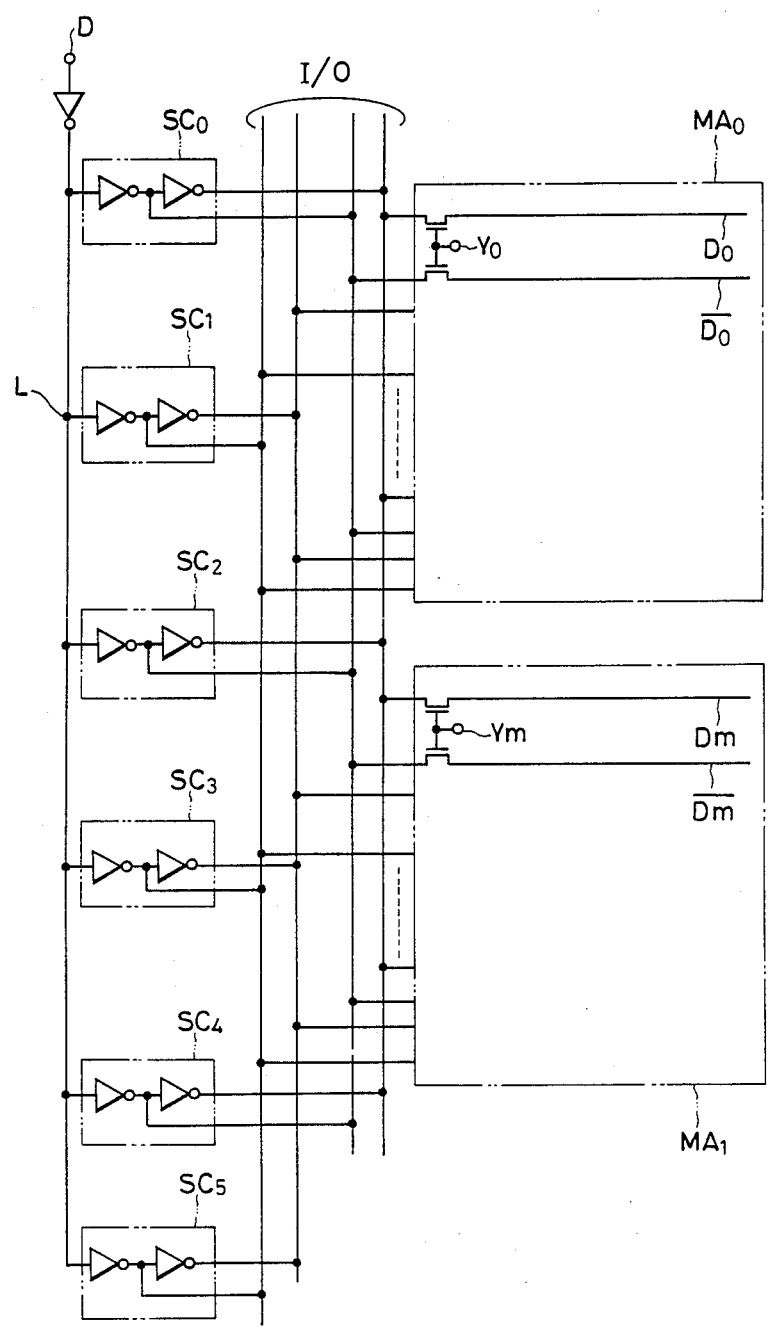

FIGS. 18A and 18B show modified examples of the embodiment shown in FIG. 17. In FIG. 18A, the signal line L is disposed in common for the right and left memory arrays. This arrangement is suitable for a large scale memory.

FIG. 18B shows the arrangement wherein a plurality of sets of common data lines are disposed. Though this modified embodiment shows two sets, four or more sets may be disposed. This arrangement is suitable for parallel processing of data.

(SEVENTH EMBODIMENT)

Figure 19:
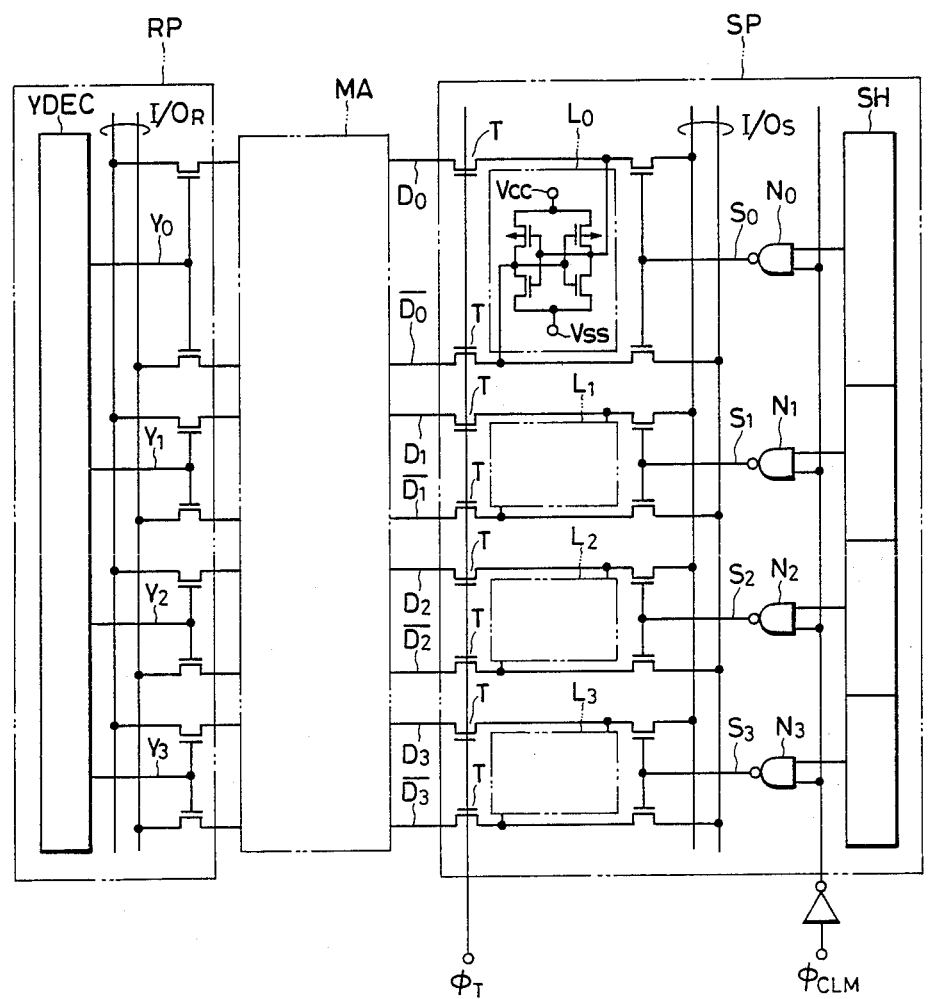
FIG. 19 shows a seventh embodiment of the present invention.

The seventh embodiment of the present invention will be described with reference to FIG. 19. Though the first to sixth embodiments deal with general-purpose DRAM, this embodiment will represent the case where the present invention is applied to a dual port memory. In FIG. 19, MA is V array including sense amplifiers. $D_0$, $\overline{D_0} \sim D_3$ and $\overline{D_3}$ are data lines. RP represents a circuit that inputs and outputs data from a random port and YDEC represents a column decoder which selects one of a plurality of data line pairs and connects the pair to common data lines. $Y_0$ through $Y_3$ are output lines of the column decoder and SP represents a circuit that inputs and outputs data from a serial port. $L_0 \sim L_3$ are latch circuits for holding the data read out from the memory array, and a shift register SH selects sequentially and one by one a plurality of latch circuits and connects it to the common data lines I/$0_s$. $S_0 \sim S_3$ are output lines of the shift register. Symbol $\phi_{CLM}$ represents a control signal for erasing the storage data which is applied to NAND circuits $N_0 \sim N_3$ and controls the output signal of the shift register. Symbol $\phi_T$ is a control signal for a transfer gate T disposed between the data line and the latch circuit.

The normal operations of the circuits described above are as follows. The data input/output operation on the random port (RP) side is the same as that of the conventional circuit explained with reference to FIG. 1, and the data input/output operation on the serial port (SP) side will be hereby described. After the memory cell signal is amplified in the memory array, the control signal $\phi_T$ of the transfer gate T is set to the High level, whereby the data of all the data line pairs are taken into the latch circuits $L_0 \sim L_3$. Thereafter $\phi_T$ changes to the Low level and the transfer gate is turned OFF. Next, the shift register SH sets one of $S_0 \sim S_3$ to the High level (In the normal operation, since the control signal for erasing the storage data $\phi_{CLM}$ is at the low level, the output of the shift register is as such outputted to $S_0 \sim S_3$.). It will be hereby assumed that $S_0$ changes to the High level. Therefore, the data held by the latch circuit $L_0$ is read out to the common data line I/$O_s$. This data is amplified by the main amplifier (not shown) and changed to the data output $D_{out}$. Next, the shift register SH operates, $S_0$ changes to the Low level and $S_1$ changes to the High level so that the data held by the latch circuit $L_1$ is read out in the same way as described above. Thereafter, $S_2$ and $S_3$ change sequentially to the High level and the data held by the latch circuits $L_2$ and $L_3$ are read out. The data write operation is made in the reverse sequence to the above. Namely, the data are sequentially written into the latch circuits $L_0 \sim L_3$ by the shift register through the common data lines and when the signal $\phi_T$ is then changed to the High level, the data of the latch circuits $L_0 \sim L_3$ can be written simultaneously into the memory array.

Next, the operation in the erase operation mode will be described. In this case, the control signal $\phi_{CLM}$ for erasing the storage data is at the High level. Therefore, all of $S_0 \sim S_3$ are at the High level and all the latch circuits are connected to the common data lines I/Os. Therefore, the predetermined data for erasing the storage data are written into all the latch circuits through I/Os. Next, the control signal $\phi_T$ of the transfer gate T changes to the High level so that the data are written into all the data lines from the latch circuits. The subsequent operations are made in the same way as in the first embodiment. Namely, when the word lines are sequentially changed to the High level, the predetermined data for erasing the storage data can be written into all the memory cells of the memory cell array.

In accordance with the embodiment described above, the predetermined data for erasing the storage data can be written simultaneously into the latch circuits. For this reason, the fast erasing operation can be made in the dual port memory, too.

(EIGHTH EMBODIMENT)

Figure 20:
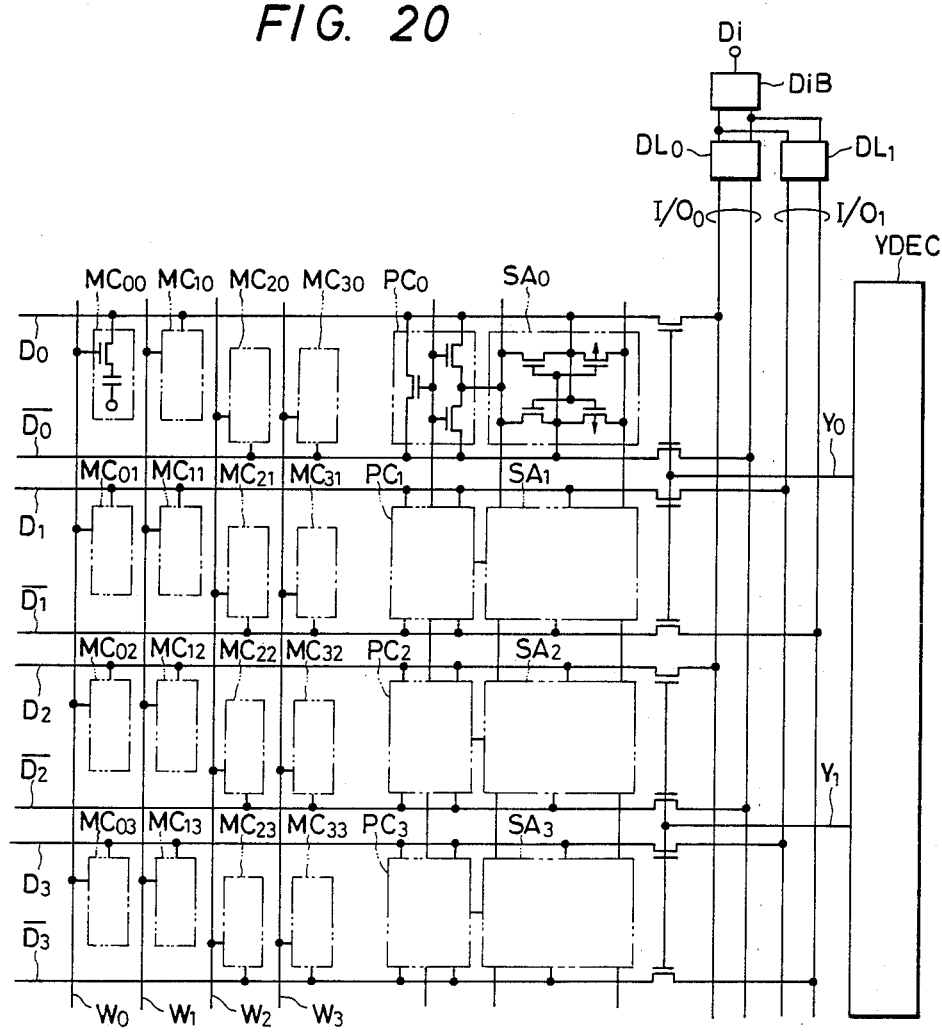
FIG. 20 shows an eighth embodiment of the present invention.

The eighth embodiment of the present invention will be described with reference to FIG. 20. This embodiment is the same as the second embodiment except that the number of common data lines I/0 is different. To simplify illustration, this drawing shows only the memory array portion, the common data lines and the column decoder. If the number of I/0 is increased, the number of data lines connected to each pair of I/0 decreases so that the load capacitance connected to I/0 decreases. Therefore, the write speed of the erasing data through I/0 can be improved. As shown in the drawing, too, two pairs of data lines are controlled by one column decoder output line so that the layout of the column decoder becomes easy.

In accordance with the present invention described above, the erasing data can be written in the unit of memory cell connected to the word line and the erase operation time of the memory cell can be reduced remarkably. When the memory cell data of an m-row by n-column memory cell array is to be erased in a cycle time $t_{RC}$, for example, the conventional method requires an $m \times n \times t_{RC}$ time but the present invention needs only $m \times t_{RC}$. Therefore, the efficiency of use of a computer can be improved remarkably.

It is to be understood by those skilled in the art that the foregoing description represents some preferred embodiments of the disclosed device and that various changes and modifications may be made in the invention without departing from the spirit and scope thereof.

What is claimed is:

1. A semiconductor dynamic random access memory comprising:
   a plurality of word lines;
   a plurality of data lines arranged in such a manner as to cross said word lines;
   memory cells electrically connected to said word lines and to said data lines;
   sense amplification circuits coupled to said data lines, respectively;
   selection means for selecting one of said word lines;
   means for selecting one of said data lines;
   means for writing predetermined data into said memory cells by use of said data lines;
   means for providing a control signal for controlling an operation of erasing storage data stored in the memory cells;
   means for precharging said data lines;
   means for sequentially selecting and driving said word lines responding to the control signal while the storage data is erased; and
   control circuit means for holding said sense amplification circuits under an on-state responding to the control signal while said word lines are sequentially selected and driven, while the storage data is erased,
   wherein said control circuit means comprises:
      a data line precharge signal control circuit for controlling said precharge means to be in an off-state while the storage data is erased, responding to the control signal; and
      a sense amplifier control circuit for controlling the sense amplification circuits to be in their on-states while the storage data is erased, responding to the control signal.

2. A semiconductor memory according to claim 1, further comprising:
   means for simultaneously selecting predetermined ones of said data lines; and
   means for simultaneously writing predetermined data into said selected data lines.

3. A semiconductor memory according to claim 1, further comprising means for holding the predetermined while said word lines are sequentially selected and driven.

4. A semiconductor dynamic random access memory according to claim 1, wherein said precharging means comprises a plurality of precharging circuits respectively coupled to predetermined pairs of said data lines.

5. A semiconductor dynamic random access memory according to claim 1, wherein each of said sense amplifier circuits is respectively coupled to a pair of said data lines.

6. A semiconductor dynamic random access memory comprising a plurality of memory arrays, each of which comprises:
   a plurality of word lines;
   a plurality of data lines arranged in such a manner as to cross said word lines;
   memory cells electrically connected to said word lines and to said data lines;
   sense amplification circuits coupled to said data lines, respectively;
   a plurality of common data lines electrically connected to said data lines;
   selection means for selecting one of said word lines;
   means for selecting one of said data lines;
   means for writing predetermined data into said memory cells by use of said data lines;
   means for providing a control signal for controlling an operation of erasing storage data stored in the memory cells;
   means for precharging said data lines;
   means for sequentially selecting and driving said word lines responding to the control signal while the storage data is erased; and
   control circuit means for holding said sense amplification circuits under an on-state responding to the control signal while said word lines are sequentially selected and driven, while the storage data is erased,
   wherein said control circuit means comprises:
      a data line precharge signal control circuit for controlling said precharge means to be in an off-state while the storage data is erased, responding to the control signal; and
      a sense amplifier control circuit for controlling the sense amplification circuits to be in their on-states while the storage data is erased, responding to the control signal.

7. A semiconductor memory according to claim 6, further comprising:
   means for simultaneously selecting predetermined ones of said data lines; and
   means for simultaneously writing predetermined data into said selected data lines.

8. A semiconductor memory according to claim 6, further comprising means for holding the predetermined data while said word lines are sequentially selected and driven.

9. A semiconductor dynamic random access memory according to claim 6, wherein said precharging means comprises a plurality of precharging circuits respectively coupled to predetermined pairs of said data lines.

10. A semiconductor dynamic random access memory according to claim 6, wherein each of said sense amplifier circuits is respectively coupled to a pair of said data lines.

11. A semiconductor dynamic random access memory comprising:
   a plurality of word lines;
   a plurality of data lines arranged in such a manner as to cross said word lines;
   memory cells electrically connected to said word lines and to said data lines;

sense amplification circuits coupled to said data lines, respectively;

selection means for selecting one of said word lines;

means for selecting at least two of said data lines;

means for writing predetermined data into said memory cells by use of said data lines;

means for providing a control signal for controlling an operation of erasing storage data stored in the memory cells;

means for precharging said data lines;

means for sequentially selecting and driving said word lines responding to the control signal while the storage data is erased; and control circuit means for holding said sense amplification circuits under an on-state responding to the control signal while said word lines are sequentially selected and driven while the storage data is erased, wherein said control circuit means comprises:
  a data line precharge signal control circuit for controlling the precharge means to be in an off-state while the storage data is erased, responding to the control signal; and
  a sense amplifier control circuit for controlling the sense amplification circuits to be in their on-states while the storage data is erased, responding to the control signal.

12. A semiconductor memory according to claim 11, further comprising:
  means for simultaneously selecting predetermined ones of said data lines; and
  means for simultaneously writing predetermined data into said selected data lines.

13. A semiconductor memory according to claim 11, further comprising means for holding the predetermined data while said word lines are sequentially selected and driven.

14. A semiconductor dynamic random access memory according to claim 11, wherein said precharging mean comprises a plurality of precharging circuits respectively coupled to predetermined pairs of said data lines.

15. A semiconductor dynamic random access memory according to claim 11, wherein each of said sense amplifier circuits is respectively coupled to a pair of said data lines.

* * * * *